US 10,832,646 B2
(45) Date of Patent: Nov. 10, 2020

(54) SOUND TRANSDUCER

(71) Applicant: Robert Bosch GmbH, Stuttgart (DE)

(72) Inventor: Matthias Karl, Ettlingen (DE)

(73) Assignee: Robert Bosch GmbH, Stuttgart (DE)

(*) Notice: Subject to any disclaimer, the term of this patent is extended or adjusted under 35 U.S.C. 154(b) by 469 days.

(21) Appl. No.: 15/737,610

(22) PCT Filed: May 9, 2016

(86) PCT No.: PCT/EP2016/060342
§ 371 (c)(1),
(2) Date: Dec. 18, 2017

(87) PCT Pub. No.: WO2017/005395
PCT Pub. Date: Jan. 12, 2017

(65) Prior Publication Data
US 2018/0174564 A1 Jun. 21, 2018

(30) Foreign Application Priority Data
Jul. 7, 2015 (DE) .................. 10 2015 212 686

(51) Int. Cl.
*B06B 1/06* (2006.01)
*G10K 9/125* (2006.01)
(Continued)

(52) U.S. Cl.
CPC ............ *G10K 9/125* (2013.01); *B06B 1/0611* (2013.01); *B06B 1/0644* (2013.01); *G10K 9/121* (2013.01); *G10K 9/122* (2013.01); *H01L 41/183* (2013.01)

(58) Field of Classification Search
CPC ....... B06B 1/06; B06B 1/0603; B06B 1/0611; B06B 1/0644
(Continued)

(56) References Cited

U.S. PATENT DOCUMENTS 4,287,582 A * 9/1981 Tocquet ................. G10K 11/08
367/155
4,420,826 A 12/1983 Marshall, Jr. et al.
(Continued)

FOREIGN PATENT DOCUMENTS

CN 1215300 A 4/1999
CN 1302171 A 7/2001
(Continued)

OTHER PUBLICATIONS

International Search Report dated Aug. 3, 2016, of the corresponding International Application PCT/EP2016/060342 filed May 9, 2016.

*Primary Examiner* — Derek J Rosenau
(74) *Attorney, Agent, or Firm* — Norton Rose Fulbright US LLP; Gerard Messina

(57) ABSTRACT

A sound transducer, including a diaphragm and at least one piezoactuator, which is situated in an operative connection to the diaphragm, the oscillation direction of the piezoactuator being situated at least generally perpendicularly in relation to the oscillation direction of the diaphragm, at least one lever element being situated between the diaphragm and the piezoactuator, which connects the diaphragm to the piezoactuator and is designed to convert oscillations of the piezoactuator into oscillations of the diaphragm and vice versa, and a clamp connection being formed between the at least one lever element, and the piezoactuator. The clamp connection is formed between an end face of the piezoactuator situated in the oscillation direction of the piezoactuator and the at least one lever element, and the piezoactuator is situated under an axial pre-tension force extending in the oscillation direction of the piezoactuator by the at least one lever element.

10 Claims, 5 Drawing Sheets

(51) Int. Cl.
  *G10K 9/12* (2006.01)
  *G10K 9/122* (2006.01)
  *H01L 41/18* (2006.01)
(58) Field of Classification Search
  USPC .......................................... 310/322, 328, 334
  See application file for complete search history.

(56) References Cited

U.S. PATENT DOCUMENTS

| | | | |
|---|---|---|---|
| 4,862,429 A | | 8/1989 | Rolt |
| 4,932,008 A | | 6/1990 | Rolt |
| 5,694,374 A | * | 12/1997 | Ripoll .................. B06B 1/0618 |
| | | | 310/337 |
| 2015/0187349 A1 | | 7/2015 | Schafer |

FOREIGN PATENT DOCUMENTS

| | | |
|---|---|---|
| DE | 10361393 B3 | 8/2005 |
| DE | 102012201884 A1 | 8/2013 |
| JP | H02145895 A | 6/1990 |
| JP | H6273900 A | 9/1994 |
| JP | H1169491 A | 3/1999 |

\* cited by examiner

SOUND TRANSDUCER

FIELD

The present invention relates to a sound transducer.

BACKGROUND

A sound transducer is described in German Patent Application No. DE 10 2012 201 884 A1. Such sound transducers are used, for example, in ultrasonic sensors, using which the distance between the ultrasonic sensor and a reflective object may be measured. The sound transducer is used as an emitter and/or receiver, an ultrasound pulse being emitted in a first step. If the ultrasound pulse is incident on a reflective object, an ultrasound echo is generated, which may be detected again via the sound transducer. The distance to the reflective object may be inferred from the time which has elapsed between emission of the ultrasound pulse and detection of the ultrasound echo and the known speed of sound. Such sound transducers are used in particular as a component of driving assistance systems to assist the driver of a vehicle during driving maneuvers. For example, multiple ultrasonic transducers are installed adjacent to one another at specific distances in relation to one another in the area of a bumper of the vehicle. Such ultrasonic sensors or sound transducers have to meet high requirements for mechanical stability. In particular in the case of sound transducers which are situated in the front of a vehicle, the sound transducers may be severely stressed in the area of their diaphragm by flying rocks or other particles. The piezoactuators or piezoelements contained therein, which essentially are made of a ceramic, must not be damaged. Breaking of the piezoelement would result in the total failure of the sound transducer. In particular for the last-mentioned reasons, not connecting the piezoelement or the piezoactuator directly (over the entire area) to the diaphragm, but rather situating the piezoactuator in parallel and at a distance to the diaphragm and connecting it via at least one lever element to the diaphragm is known from the document mentioned at the outset. In the previously known document, it is provided in particular that at least one lever element is adhesively bonded to the piezoactuator on the side facing toward the piezoactuator in the area of the end face of the piezoactuator. In the event of oscillation of the piezoactuator in an oscillation plane situated in parallel to the plane of the diaphragm, the diaphragm is also set into oscillations via the at least one lever element, the oscillation plane of the diaphragm extending perpendicularly to the oscillation plane of the piezoactuator. Furthermore, it may be gathered from the cited document that the ratio of force and deflection of the diaphragm may be designed by way of the length of the at least one lever element. In particular, different transmission ratios of the oscillation amplitudes between the piezoactuator and the diaphragm may thus be achieved. It is also mentioned that instead of the adhesive bonds which are disclosed and shown in the document, clamp connections may also be provided in the edge area of the piezoelement or piezoactuator. More detailed specifications of how such a clamp connection may be formed may not be gathered from the cited document, however.

SUMMARY

The present invention relate to the refinement of a sound transducer in such a way that a structurally advantageous connection is formed between the piezoactuator and the at least one lever element.

This object may be achieved according to the present invention by providing a sound transducer in which the clamp connection is formed in the area between an end face of the piezoactuator situated in the oscillation direction of the piezoactuator and the at least one lever element, and the piezoactuator is situated by the at least one lever element under axial pre-tension force.

Such an arrangement in particular enables the radial installation space which is typically available in the area of the piezoactuator to be utilized for the formation of the clamp connection and therefore, for example, the distance between the piezoactuator and the diaphragm to be reduced, which reduces the overall height of the sound transducer. In addition, the application of the axial pre-tension force by the at least one lever element to the piezoactuator enables the piezoceramic of the piezoactuator to be clamped using a mechanical pre-tension. The charge shift linked thereto defines an operating point, the mechanical pre-tension being able to improve the efficiency of the piezoactuator.

Advantageous refinements of the sound transducer according to the present invention are described herein.

In a structurally preferred embodiment of the clamp connection, it is designed as a formfitting connection, in which the at least one lever element or the piezoactuator has a receptacle for the formfitting accommodation of the piezoactuator in the area of its end face. Such a design in particular enables a particularly secure hold and/or a particularly secure clamp connection during the oscillation of the piezoactuator and therefore a particularly reliable connection between the at least one lever element and the piezoactuator.

In a further structurally preferred embodiment of the clamp connection, it is provided that the clamp connection includes a concave contact surface between the piezoactuator and the at least one lever element to form a self-centering clamp connection. Slipping of the piezoactuator in relation to the at least one lever element thus results in a higher mechanical clamping tension, which finally promotes slipping back into the specified clamping position, in which the clamping takes place under minimal mechanical tension.

To form a particularly mechanically robust piezoactuator with sufficiently large lift for generating the oscillations at the same time, it may additionally be provided that the piezoactuator is designed as a stacked piezoactuator having multiple piezoelements acting in the direction of the oscillation plane of the piezoactuator, whose oscillation amplitudes are added together in the oscillation plane of the piezoactuator.

In an embodiment of the at least one lever element which is preferred for manufacturing, it is integrally situated and/or formed on the diaphragm.

In a further structurally preferred embodiment, it may be provided that two lever elements articulated with one another in an axis may be provided, and the axis may preferably be situated aligned with a center plane of the piezoactuator situated perpendicularly in relation to the oscillation plane of the piezoactuator.

To enable a preferably simple installation process of such a sound transducer and optionally in addition to be able to use different materials for the diaphragm and the at least one lever element, and a geometry of the at least one lever element, which cannot be manufactured integrally from the diaphragm, in a refinement of the last suggestion made, the two lever elements are preferably connected with the aid of a clamp or detent connection to extensions of the diaphragm. The extensions may be integrally formed on the diaphragm, for example, and may also have a relatively short length, so that they may be produced relatively simply.

To improve the functionality of the sound transducer and/or to avoid the emission of oscillations in undesirable directions, it is provided in addition that the diaphragm or the sound transducer is equipped with means for damping and/or decoupling oscillations in a direction situated perpendicularly in relation to the oscillation plane of the diaphragm. Such means may be formed, for example, by the formation of a preferably radially circumferential bead in the area of the diaphragm, the material thickness of the diaphragm being reduced in the area of the bead. Alternatively, however, instead of a bead, an increase of the thickness of the diaphragm may also be provided in the mentioned area. In addition, an attenuator separate from the diaphragm in the form of a foam or the like may be provided in the interior of the sound transducer, to avoid or reduce an emission of sound waves in undesirable directions.

Metals, preferably aluminum, and ceramic materials or a composite material come into consideration as the material for the diaphragm. In particular in the case of lever elements integrally situated on the diaphragm, it may optionally be particularly advantageous (depending on the geometry of the lever element) to form such a diaphragm from a composite material, since relatively complex geometrical shapes may thus typically also be manufactured.

In conventional ultrasonic transducers, the piezoactuators are connected via wire or bond connections to a circuit carrier, typically in the form of a circuit board or the like, the diaphragm representing a component separate from the circuit carrier. To achieve a particularly compact sound transducer having relatively few components, it may be provided in a modified embodiment that the diaphragm is part of a flexible circuit board film, and the circuit board film is only equipped with components on the side facing away from an emission direction of the diaphragm. The circuit board film therefore forms the diaphragm itself, so that a separate circuit carrier may be omitted.

Further advantages, features, and details of the present invention result from the description below of preferred exemplary embodiments and on the basis of the figures.

DETAILED DESCRIPTION OF EXAMPLE EMBODIMENTS

Figure 1:
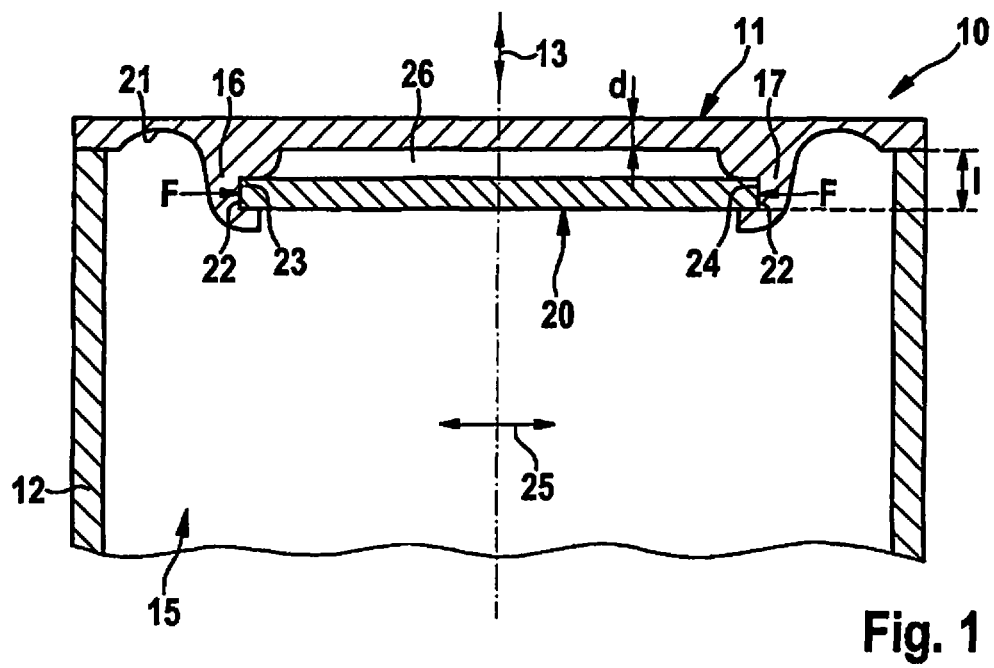
FIG. 1 shows a simplified longitudinal section through a first sound transducer in the area of the piezoactuator including a clamp connection formed in the form of a formfitting receptacle.

Identical elements and elements having identical functions are provided with identical reference numerals in the figures.

FIG. 1 shows a partial area of a sound transducer 10, as is used in particular as a component of a driver assistance system for detecting distances between sound transducer 10 and a vehicle (not shown) and objects. In particular, multiple such sound transducers 10 may be provided offset in relation to one another by certain lateral distances in the area of a bumper in the rear area or in the front area of the vehicle.

Sound transducer 10 includes a diaphragm 11, which is made of metal, for example, in particular of aluminum, or alternatively of a composite material or ceramic. Diaphragm 11 forms an end face of a housing 12, which is only shown sectionally, of sound transducer 10 and may be decoupled by decoupling means (not shown), for example, from housing 12. Housing 12 is in turn inserted in a known way into a recess (not shown) of a bumper of the vehicle and preferably extends flush with the bumper.

Diaphragm 11 has a round cross section in particular and is able to oscillate in the direction of double arrow 13, which represents the direction of the oscillation plane of diaphragm 11. On the side facing toward an interior 15 of housing 12, two lever elements 16, 17, which are used for fastening a disk-shaped piezoactuator 20, which includes a piezoceramic, are integrally formed on diaphragm 11. In particular, diaphragm 11 has a constant thickness d in the area between the two identically formed lever elements 16, 17. Thickness d of diaphragm 11 is reduced by a radial circumferential bead 21 in an area situated radially outside the two lever elements 16, 17.

The two lever elements 16, 17 each have a receptacle 22, which is approximately U-shaped in cross section, and which is designed to enclose piezoactuator 20 in the area of the two opposing end faces 23, 24. A formfitting clamp connection is thus formed between the two lever elements 16, 17 and piezoactuator 22, which enables secure holding and positioning of piezoactuator 20 in relation to diaphragm 11 even without the use of adhesive. Piezoactuator 20 has an oscillation plane, which extends in the direction of double arrow 25, the two double arrows 13, 25 and the oscillation plane of diaphragm 11 and of piezoactuator 20 being situated at least essentially perpendicularly in relation to one another, and the two end faces 23, 24 being situated perpendicularly in relation to double arrow 25. A clearance 26, which enables an oscillation or deformation of diaphragm 11, is formed between piezoactuator 20 and diaphragm 11, which are therefore preferably situated in parallel to one another. The two lever elements 16, 17 each have a lever length l between receptacle 22 and diaphragm 11 in relation to a direction extending perpendicularly to the plane of diaphragm 11 and are additionally made essentially rigid.

FIG. 1 shows the state in which sound transducer 10 and piezoactuator 10 (and therefore also diaphragm 11) is not excited into oscillations. During an oscillation of piezoactuator 20 in the direction of double arrow 25, the oscillations of piezoactuator 10 are transmitted via the two lever elements 16, 17 to diaphragm 11 and introduced therein, which in turn results in an oscillation of diaphragm 11 in the direction of double arrow 13. It is also essential that due to the arrangement or geometrical formation of lever elements 16, 17, an axial pre-tension force F extending in the plane of piezoactuator 20 is introduced via lever elements 16, 17 in the area of the two end faces 23, 24 of piezoactuator 20, and piezoactuator 20 is therefore "pre-tensioned" in the axial direction.

Figure 2:
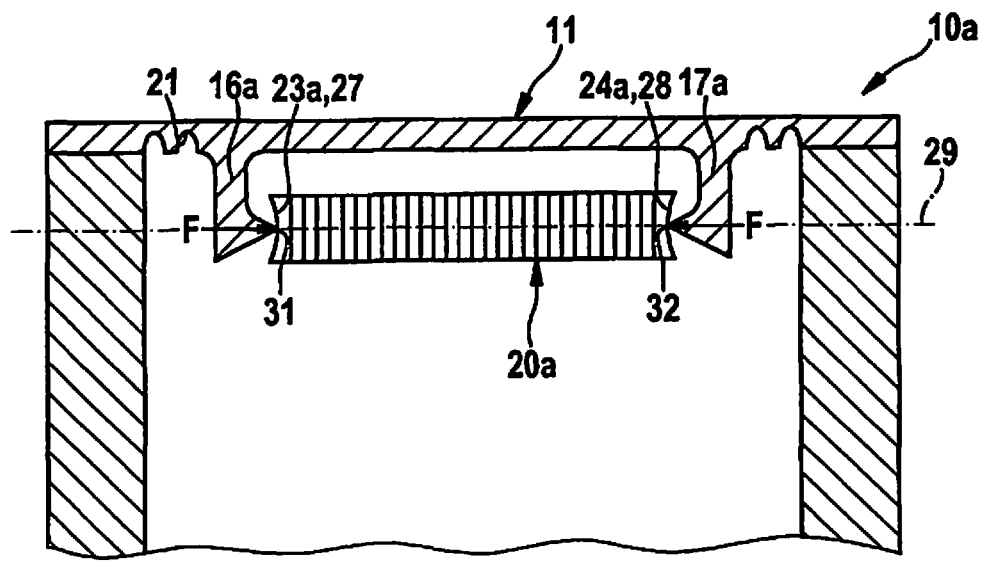
FIG. 2 shows a sound transducer modified in relation to FIG. 1 including a self-centering clamp connection, also in longitudinal section.

Sound transducer 10a shown in FIG. 2 differs from sound transducer 10 in that piezoactuator 20a is equipped in the area of each of the two end faces 23a, 24a with a concave contact surface 27, 28, the two contact surfaces 27, 28 extending symmetrically in relation to a center plane 29 of piezoactuator 20a, in which a linear contact also takes place between contact edges 31, 32 of lever elements 16a, 17a on piezoactuator 20a. In sound transducer 10a, it is provided that an axial pre-tension force F is also introduced into piezoactuator 20a via each of lever elements 16, 17 in the area of the two end faces 23, 24 of piezoactuator 20a.

Figure 3:
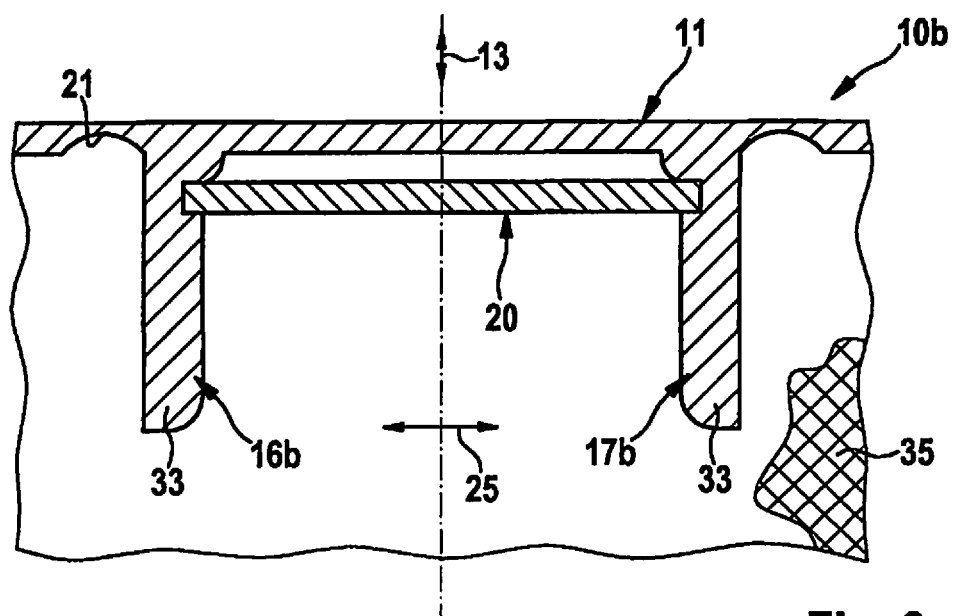
FIG. 3 shows an exemplary embodiment modified in relation to FIG. 1 including attenuators situated on the diaphragm, in longitudinal section.

Sound transducer 10b shown in FIG. 3 differs from sound transducer 10 according to FIG. 1 essentially in that the two lever elements 16b, 17b are each formed having an extension 33 on the side facing away from diaphragm 11. Due to the geometrical formation or mass of extensions 33, signals emitted by diaphragm 11 or sound transducer 10b are attenuated and/or damped in a direction extending transversely in relation to the direction of double arrow 13. Additionally or alternatively, it may be provided that extensions 33 may have a resonance frequency which differs significantly from the frequency at which diaphragm 11 is activated, which is preferably the resonance frequency of diaphragm 11. The different oscillation properties of diaphragm 11 and lever elements 16b, 17b thus prevent a so-called acoustical short-circuit between adjacent sound transducers. Alternatively or additionally, it may also be provided that a damping material 35, as is known per se from the related art and is therefore only shown sectionally, may be situated, for example, in the area of interior 15 of housing 12.

Figure 4:
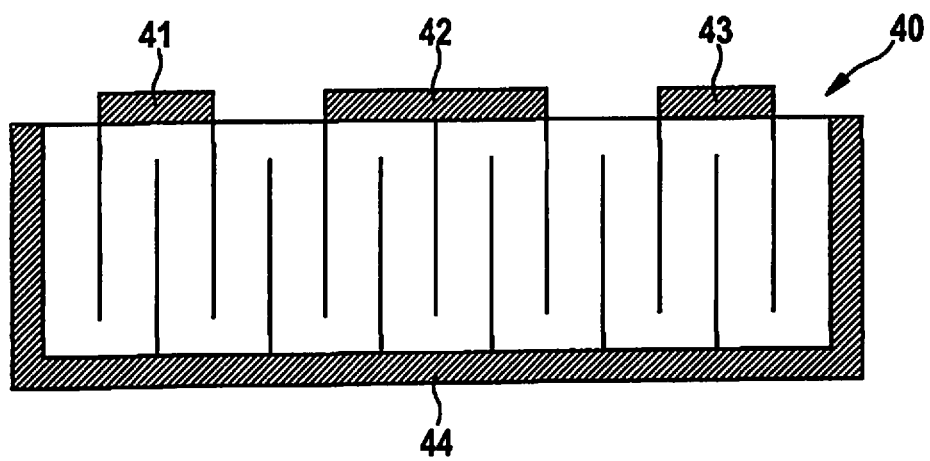
FIG. 4 shows a simplified section through a piezoactuator made of multiple piezoelements, as may alternatively be used in the sound transducers.

Above-described piezoactuators 20, 20a have a relatively small thickness, since the active piezolayers are situated in parallel to the plane of piezoactuator 20, 20a. Instead of such a piezoactuator 20, 20a, a piezoactuator 40 corresponding to the illustration of FIG. 4 may alternatively also be used. Piezoactuator 40 is designed as a so-called stacked piezoactuator 40, in which multiple piezoelements 41 through 44, each having a plurality of piezoceramic layers, are connected to one another in such a way that their expansions add together.

Figure 5:
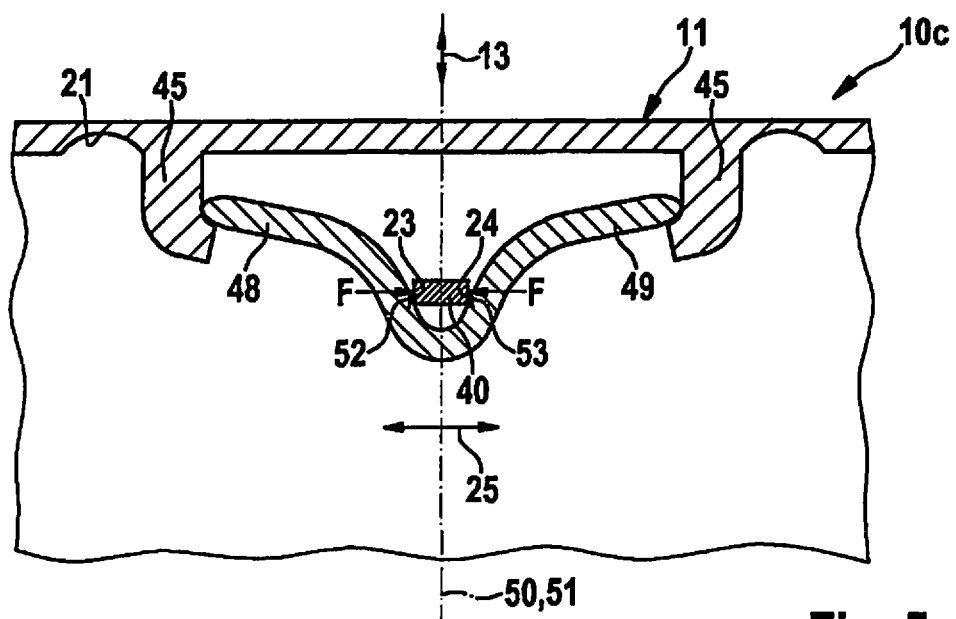
FIG. 5 shows a longitudinal section through a further modified sound transducer using two lever elements articulated with one another.

FIG. 5 shows sectionally a sound transducer 10c, in which only relatively short extensions 45, 46 are situated or formed on its diaphragm 11. The end areas of lever element 48, 49, which are articulated with one another with the aid of an axis 51 in the area of a center plane 50 situated perpendicularly in relation to the oscillation plane of piezoactuator 40, engages in each of the two extensions 45, 46. On the sides facing toward end faces 23, 24 of piezoactuator 40, the two lever elements 48, 49 have receptacle surfaces 52, 53, which enable a clamping accommodation of piezoactuator 40 with application of an axial pre-tension force F on end faces 23, 24. During an oscillation of piezoactuator 40 in the direction of double arrow 25, the angle between two lever elements 48, 49 changes, and therefore also their mutual distance in the area of extensions 45, 46, which results in a deformation or oscillation of diaphragm 11 in the direction of double arrow 13. Because lever elements 48, 49 are formed as components separate from diaphragm 11, lever elements 48, 49 may in particular be made of a material different from diaphragm 11.

Figure 6:
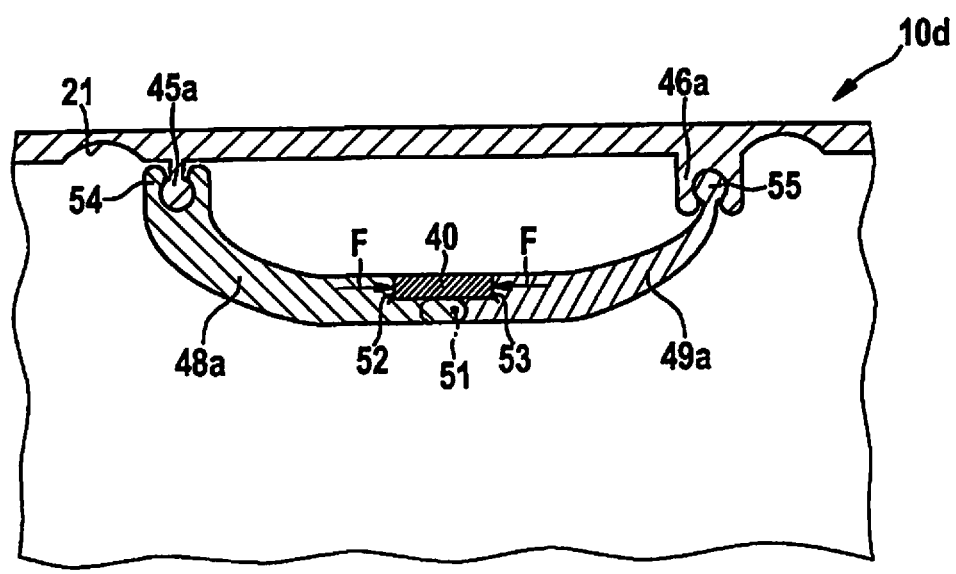
FIG. 6 shows a longitudinal section through an exemplary embodiment modified in relation to FIG. 5, in which the lever elements are connected to the diaphragm via a detent connection.

In sound transducer 10d shown in FIG. 6, extensions 45a, 46a are formed as convex and having a receptacle, which interacts with correspondingly formed end areas 54, 55 of lever elements 48a, 49a in such a way that lever elements 48a, 49a are pivotably situated in the area of extensions 45a, 46a. In addition, the two lever elements 48a, 49a, in contrast to lever elements 48, 49 in sound transducer 10c, are aligned at least essentially in a shared plane in relation to one another at least in the area of piezoactuator 40.

Figure 7:
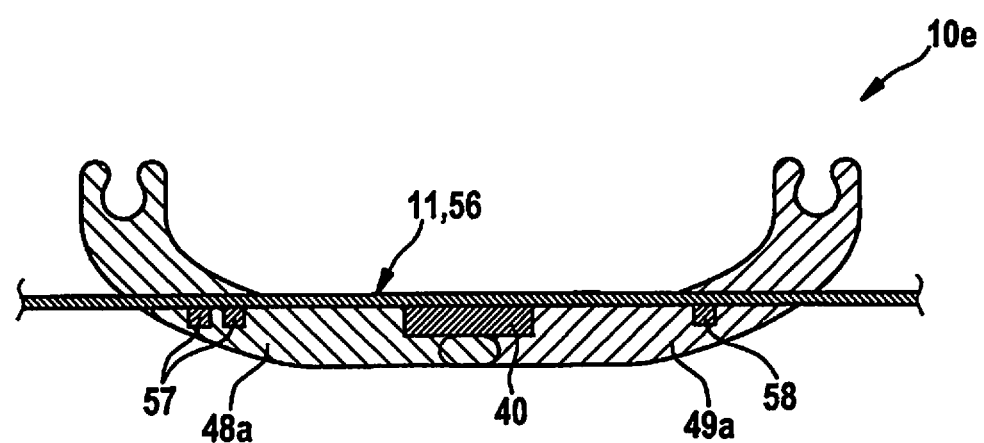
FIG. 7 shows an exemplary embodiment modified in relation to FIG. 6, in which the piezoactuator is fastened directly on a flexible circuit board film forming a diaphragm.

Partially illustrated sound transducer 10e according to FIG. 7 is distinguished in that instead of an above-described diaphragm 11, a flexible circuit board film 56 is used, which is able to oscillate per se and assumes the function of diaphragm 11. Piezoactuator 40 and, for example, other components 57, 58 are connected to circuit board film 56 on the side facing toward interior 15 (not shown) of sound transducer 10e.

Figure 8:
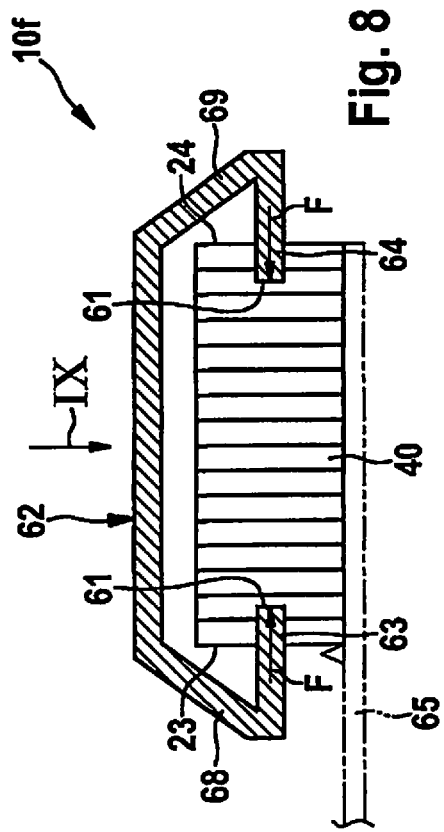
FIG. 8 shows a longitudinal section through a further sound transducer in the area of the piezoactuator.
Figure 9:
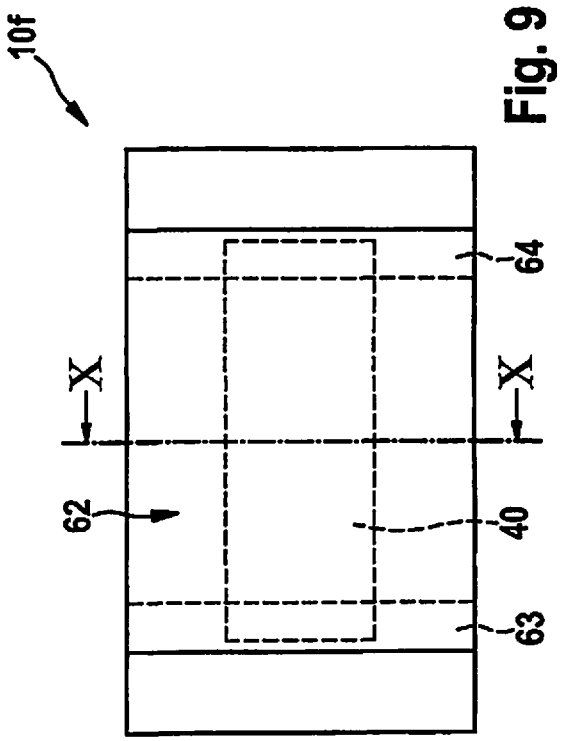
FIG. 9 shows a top view in the direction of the arrow IX of FIG. 8.
Figure 10:
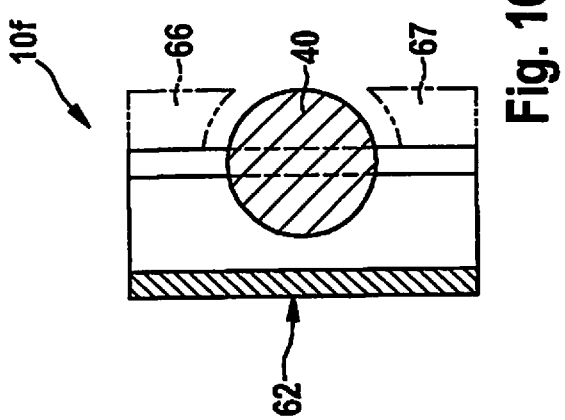
FIG. 10 shows a section in plane IX-IX of FIG. 9.

Lastly, a further sound transducer 10f is shown in FIGS. 8 through 10, whose piezoactuator 40 has a grooved recess 61 extending perpendicularly in relation to the plane of FIG. 8 in the area of each of the two end faces 23, 24, in which a bent-over end section 63, 64 of a diaphragm 62 engages. Because the distance of the two end sections 63, 64 of diaphragm 62, which engage in recesses 61, is less in the unloaded state than the distance between the two grooved bases of recesses 61, via diaphragm 62, similarly to above-described sound transducers 10, 10a through 10e, an axial pre-tension force F is exerted on piezoactuator 40. The two end sections 63, 64 are connected to diaphragm 62 via lever elements 68, 69, which are situated inclined in relation to the plane of diaphragm 62. As already indicated, diaphragm 62 may be formed as an integral component together with end sections 63, 64 and lever elements 68, 69. However, it is also possible or reasonable to form lever elements 68, 69 together with end sections 63, 64 as components separate from diaphragm 62. Furthermore, it may optionally be provided that piezoactuator 40 is connected on the side facing away from diaphragm 62 to a circuit board 65 or a circuit carrier. Lastly, it may be provided according to the illustration of FIG. 10 that reflector elements 66, 67, which enable a reflection of sound waves in the direction of diaphragm 62, are provided on the side facing away from diaphragm 62.

Above-described sound transducers 10, 10a through 10f may be altered or modified in manifold ways without departing from the present invention.

What is claimed is:
1. A sound transducer, comprising:
   a diaphragm
   at least one piezoactuator situated in an operative connection to the diaphragm, an oscillation direction of the piezoactuator being situated perpendicularly in relation to the oscillation direction of the diaphragm;
   at least one lever element situated between the diaphragm and the piezoactuator, which connects the diaphragm to the piezoactuator and is designed to convert oscillations of the piezoactuator into oscillations of the diaphragm and vice versa; and
   a clamp connection formed between the at least one lever element and the piezoactuator, wherein the clamp connection is formed between an end face of the piezoactuator situated in the oscillation direction of the piezoactuator and the at least one lever element, and the piezoactuator is situated under an axial pre-tension force extending in the oscillation direction of the piezoactuator by the at least one lever element, wherein the at least one piezoactuator has, in an area of the end face, a concave contact surface which extends symmetrically in relation to a center plane of the piezoactuator.

2. The sound transducer as recited in claim 1, wherein the clamp connection is a formfitting connection, in which one of the at least one lever element or the piezoactuator, has a receptacle for the formfitting contact of the piezoactuator in the area of its end face.

3. The sound transducer as recited in claim 1, wherein the clamp connection includes a concave contact surface between the piezoactuator and the at least one lever element to form a self-centering clamp connection.

4. The sound transducer as recited in claim 1, wherein the piezoactuator is a stacked piezoactuator including multiple piezoelements acting in the oscillation direction of the piezoactuator, whose oscillation amplitudes are added together in the oscillation direction of the piezoactuator.

5. The sound transducer as recited in claim 1, wherein the at least one lever element forms an integral component together with the diaphragm.

6. The sound transducer as recited in claim 1, wherein the two lever elements are provided, which are articulated with one another by an axis, and the axis is situated aligned with the center plane of the piezoactuator situated perpendicularly in relation to the oscillation direction of the piezoactuator.

7. The sound transducer as recited in claim 6, wherein the two lever elements are connected, with the aid of one of a clamp or detent connection, to extensions of the diaphragm.

8. The sound transducer as recited in claim 6, wherein an arrangement is provided for at least one of attenuating oscillations and decoupling oscillations, in a direction situated perpendicularly in relation to the oscillation direction of the diaphragm.

9. The sound transducer as recited in claim 1, wherein the diaphragm is made of one of aluminum, a ceramic, or a composite material.

10. A sound transducer, comprising:
a diaphragm
at least one piezoactuator situated in an operative connection to the diaphragm, an oscillation direction of the piezoactuator being situated perpendicularly in relation to the oscillation direction of the diaphragm;
at least one lever element situated between the diaphragm and the piezoactuator, which connects the diaphragm to the piezoactuator and is designed to convert oscillations of the piezoactuator into oscillations of the diaphragm and vice versa; and
a clamp connection formed between the at least one lever element and the piezoactuator, wherein the clamp connection is formed between an end face of the piezoactuator situated in the oscillation direction of the piezoactuator and the at least one lever element, and the piezoactuator is situated under an axial pre-tension force extending in the oscillation direction of the piezoactuator by the at least one lever element,
wherein the diaphragm is part of a flexible circuit board film, and the circuit board film is equipped only with components and the piezoactuator on the side facing away from an emission direction of the diaphragm.

* * * * *